(12) United States Patent
Goihl

(10) Patent No.: US 7,645,054 B2
(45) Date of Patent: Jan. 12, 2010

(54) ILLUMINATING UNIT COMPRISING AN OPTICAL ELEMENT

(75) Inventor: Rupert Goihl, Steinsdorf (DE)

(73) Assignee: Patent-Treuhand-Gesellschaft für elektrische Glühlampen mbH, München (DE)

( * ) Notice: Subject to any disclaimer, the term of this patent is extended or adjusted under 35 U.S.C. 154(b) by 0 days.

(21) Appl. No.: 11/901,669

(22) Filed: Sep. 17, 2007

(65) Prior Publication Data

US 2008/0068852 A1 Mar. 20, 2008

(30) Foreign Application Priority Data

Sep. 15, 2006 (DE) .................... 10 2006 043 402

(51) Int. Cl.
*F21V 5/00* (2006.01)

(52) U.S. Cl. .................. 362/244; 362/337; 362/511

(58) Field of Classification Search ........... 362/244, 362/251, 255, 256, 329, 336, 337, 338, 511, 362/520, 545, 800; 359/16, 19
See application file for complete search history.

(56) References Cited

U.S. PATENT DOCUMENTS

| 4,245,882 | A | * | 1/1981 | Chang | 359/19 |
| 4,722,037 | A | * | 1/1988 | Davis | 362/231 |
| 5,455,747 | A | * | 10/1995 | Aoyama | 362/545 |
| 5,568,967 | A | * | 10/1996 | Sikkens et al. | 362/255 |
| 5,669,693 | A | | 9/1997 | Smith | |
| 6,151,163 | A | * | 11/2000 | Hall et al. | 359/457 |
| 2003/0137838 | A1 | | 7/2003 | Rizkin et al. | |
| 2004/0114355 | A1 | | 6/2004 | Rizkin et al. | |
| 2005/0195457 | A1 | | 9/2005 | Schmitt | |
| 2006/0044806 | A1 | * | 3/2006 | Abramov et al. | 362/337 |
| 2006/0092644 | A1 | * | 5/2006 | Mok et al. | 362/800 |

FOREIGN PATENT DOCUMENTS

| CA | 2 574 995 | 2/2006 |
| DE | 44 21 306 | 1/1995 |
| DE | 693 18 354 | 9/1998 |
| DE | 100 09 783 | 9/2001 |
| DE | 10 2004 004 772 | 8/2005 |
| DE | 10 2005 005 265 | 8/2006 |
| EP | 0 584 547 | 7/1993 |
| EP | 0 738 904 | 4/1996 |
| GB | 2 323 917 | 10/1998 |
| JP | 2005340929 A * | 12/2005 |
| WO | WO 95/34008 | 12/2005 |
| WO | WO 2005/121641 | 12/2005 |
| WO | WO 2006/012834 | 2/2006 |
| WO | WO 2006/081805 | 2/2006 |

OTHER PUBLICATIONS

A. Sinha et al., "Imaging using volume holograms", Optical Engineering, vol. 43, No. 9, pp. 1959-1972, Sep. 2004.

* cited by examiner

*Primary Examiner*—Y My Quach Lee
(74) *Attorney, Agent, or Firm*—Cohen Pontani Lieberman & Pavane LLP

(57) ABSTRACT

An illuminating unit comprising a luminous means (5) and an optical element (1) that has a radiation entrance surface (2) facing the luminous means (5) and a radiation exit surface (3) averted from the luminous means (5). The optical element (1) has at least one holographic element (4) that is designed as a beam shaping element for the radiation (7) emitted from the luminous means (5).

24 Claims, 12 Drawing Sheets

ILLUMINATING UNIT COMPRISING AN OPTICAL ELEMENT

RELATED APPLICATION

This patent application claims the priority of German patent application 10 2006 043 402.1 filed Sep. 15, 2006, the disclosure content of which is hereby incorporated by reference.

FIELD OF THE INVENTION

The invention relates to an illuminating unit, in particular an LED illuminating unit, that has an optical element provided for beam shaping of the radiation emitted from a luminous means.

BACKGROUND OF THE INVENTION

Such an illuminating unit is disclosed, for example, in publication DE 102004004772 A1.

LEDs or thermal emitters are based on the principle of spontaneous emission such that the radiation emitted from the respective luminous means is emitted in all spatial directions, without a preferred direction, in the absence of measures used for beam shaping. Consequently, for the purpose of beam shaping of the radiation emitted from the luminous means, use is made in illuminating units of optical elements that are based as a rule on reflection or refraction of the light, such as mirrors, lenses or combinations of such elements.

So called TIR lenses that are based on the principle of total internal reflection, for example, are known for beam shaping an LED light source. In order to attain good beam shaping, such lenses generally have a diameter to height ratio of typically approximately 2:1.

Furthermore, Fresnel lenses are frequently used for beam shaping an LED light source. Because of the comparatively large focal length of a Fresnel lens, it can be difficult to bring the latter close enough to the LED in order to capture the flat emerging light.

Suitability of holographic optics for incoherent white light is known from the publications I. Weingartner, K. J. Rosenbruch, "Incoherent polychromatic imaging with holographic optical elements and systems I", Optik, Vol. 57 (1980), p. 103 ff. and S. Prakash, N. Deva Das, "Imaging in white light using compact two hololens systems", J. Optics, Vol. 26 (1995), p. 267 ff.

SUMMARY OF THE INVENTION

An object of the present invention is to provide an illuminating unit comprising an improved optical element that is distinguished, in particular, by a low overall height and enhanced possibilities for modifying the radiation distribution of the radiation emitted from the luminous means.

This and other objects are attained in accordance with one aspect of the invention directed to an illuminating unit comprising a luminous means and an optical element that has a radiation entrance surface facing the luminous means and a radiation exit surface averted from the luminous means. The optical element has at least one holographic element that is designed as a beam shaping element for shaping the radiation emitted from the luminous means.

The holographic element formed in or on the optical element has the advantage that it is possible to attain a comparatively low overall height by comparison with conventional optical elements. In particular, the holographic element can have the function of a lens or a lens system. Even complex optics that, for example, include multilens objectives or mirrors can advantageously be copied in the hologram. A holographic element offers expanded beam shaping possibilities by comparison with conventional optics particularly when it is impossible for lack of space to arrange any complex optical elements downstream of the luminous means in the illuminating unit. An optical element that includes a holographic element is particularly well suited for varying the beam shape of a motor vehicle headlight.

In one advantageous embodiment of the invention, the optical element has a height h of 8 mm or less. The height h is preferably 5 mm or less, in particular preferably even 3 mm or less. The overall height of the illuminating unit is therefore comparatively slight by comparison with illuminating units comprising conventional optical elements.

Furthermore, it is advantageous for attaining comparatively slight overall height when the radiation exit surface of the optical element is a substantially flat surface. Here, a substantially flat surface is understood as a surface that has no macroscopic curvature, but this does not exclude that microstructures such as, for example, microlenses or microprisms, from being formed on the beam exit surface.

The holographic element is, for example, arranged on the radiation entrance surface of the optical element. In the case of another embodiment of the invention, the holographic element is arranged on the beam exit surface of the optical element. In these cases, the holographic element is respectively a surface hologram that, for example, is produced in a photosensitive material arranged on the surface of the optical element. Alternatively, the surface hologram can also be designed as a surface relief hologram, the holographic microstructures being produced on the surface of the optical element with the aid of the fabrication and production methods known for the fabrication of CDs or DVDs. In the case of this variant, the optical element is preferably fabricated from a polymer, in particular from polycarbonate. It is possible, in particular, to use an injection molding method for the cost effective fabrication of such an optical element. Alternatively, it is also possible to bring glass, for example, into such a form by means of a pressing method. Surface holograms are discussed in published US patent application US 2005/0195457 A1. Surface relief holograms are discussed in published International application WO 95/34008.

The holographic element is preferably a volume hologram formed in the optical element. The holographic structure is in this case produced in the interior of the optical element by holographic exposure of a photosensitive material. For example, the material of the optical element can be a photosensitive polymer or glass. Alternatively, the photosensitive material can be embodied in the optical element, for example by embedding the photosensitive material in the form of a layer between two plastic or glass elements serving, in particular, to protect the hologram. Volume holograms are discussed in the following article by A. Sinha et al., "Imaging using volume holograms", Optical Engineering, Vol. 43, No. 9, September 2004.

Furthermore, the holographic element can, for example, also be formed in a glass by an ion exchange process. In this case, a local change in the refractive index in the glass is produced by the exchange of one ion type, such as $Na^+$, for example, by another ion type such as, for example, $Ag^+$. The locations of the intrusion, and the quantity of the exchange ions can be defined by applying and patterning a mask in advance.

In the case of a volume hologram, the holographic structure is advantageously protected against environmental influences, in particular against mechanical damage, moisture or dirt.

A hologram can fundamentally influence the phase or the amplitude of the light. Phase holograms are preferred for attaining high illuminances on the basis of their relatively high diffraction efficiencies, the point being that amplitude holograms absorb a substantial portion of the light. Surface relief holograms also act as phase holograms.

Holographic optical elements have a chromatic aberration because they are based on the diffraction of the light as a function of wavelength. In order to reduce the chromatic aberrations, it is advantageous to combine two or more holographic elements, in particular it is possible to arrange two or more holographic elements sequentially. For example, the optical element can have two or more transmission holograms that are, for example, accommodated on the radiation entrance surface, the radiation exit surface and/or in the volume of the optical element. In the case of a luminous means for white light, the correction of the chromatic aberration for two colors as in the case of achromatic lens combination can take place through combination of at least two holographic optical elements. A correction of the chromatic aberration for three colors (corresponding to apochromatic lens combination) can be attained with the aid of at least three holographic elements.

In one preferred embodiment, the luminous means of the illuminating unit is an LED chip. The luminous means can also have a plurality of LED chips, for example a multiplicity of LED chips mounted on a common substrate. In particular, it can be provided that the radiation of the individual LED chips strikes various subareas of the holographic element that respectively guide the emitted radiation in a predetermined direction.

The individual LED chips can preferably be driven individually such that a temporarily variable beam shape of the illuminating unit is attained by switching the individual LED chips on or off or by changing their intensity.

The optical element can have refractive microoptical elements, in particular microlenses or microprisms, on the radiation entrance surface and/or on the radiation exit surface. For example, a holographic element can be formed on the radiation entrance surface, while refractive microoptical elements are arranged on the radiation exit surface. The reverse case is likewise conceivable, namely that refractive microoptical structures are formed on the radiation entrance surface while a holographic element is formed on the radiation exit surface. It is furthermore, also possible for the optical element to have a volume hologram, a refractive microoptical structure, for example a microlenses array or a microprism array, being formed on the radiation entrance surface and/or on the radiation exit surface.

The microlenses of a microlenses array, or the microprisms of a microprism array have a chromatic aberration that can lead to undesired color fringes. Through superposing the color fringes of neighboring microlenses, it is possible by additive color mixing to reduce the chromatic aberrations, or even to correct them again to white light. A suitable arrangement of the microlenses or microprisms in the case of which color fringes are avoided as far as is possible, can be found by simulation calculations. It is likewise possible in this way to reduce the chromatic aberrations of an upstream or downstream holographic optical element. The microlenses array or microprism array can also be of holographic design, particularly individual microlenses or microprisms can, for example, be components of a surface relief hologram.

In order to reduce reflection losses upon entrance and/or exit of the radiation emitted from the luminous means into the optical element and from the optical element, respectively, the radiation entrance surface and/or the radiation exit surface advantageously have/has a reflection reducing coating.

In a further preferred embodiment, the radiation entrance surface of the optical element has a substantially flat surface. Here, a substantially flat surface is understood as a surface that has no macroscopic curvature apart from a microoptical structure. A particularly low overall height of the illuminating unit can be achieved when both the radiation entrance surface and the radiation exit surface of the optical element are respectively substantially flat surfaces.

In a further embodiment, the radiation entrance surface has a cutout. In this case, the luminous means is advantageously positioned in the cutout or below the cutout in such a way that as large a fraction as possible of the radiation emitted from the luminous means strikes the radiation entrance surface of the optical element at as small an incidence angle as possible. Reflection losses that could result from radiation striking the optical element at large incidence angles are reduced in this way. The cutout can have a concave curvature, for example. In another preferred embodiment, the cutout has the shape of a conical frustum.

The optical element can advantageously be positioned very near the luminous means. The distance between the luminous means, in particular an LED, and the radiation entrance surface is preferably 1 mm or less. The overall height of the illuminating unit is therefore advantageously low by comparison with the illuminating units comprising conventional optical elements, which can frequently not be positioned close to the luminous means because of an excessively long focal lens of the lens elements.

In a further embodiment, the radiation entrance surface has a Fresnel lens structure.

In one preferred embodiment, an immersion liquid is contained between the luminous means and the optical element. Reflection losses upon entrance into the optical element of the radiation emitted from the luminous means are reduced in this way.

In a further embodiment, a second optical element is included as primary optics for the luminous means between the luminous means and the radiation entrance surface of the optical element. The primary optics is preferably designed in such a way that the light beams strike the optical element at a small incidence angle. For example, the second optical element can be a rod-shaped light guide, the radiation emerging from the light guide striking the radiation entrance surface of the optical element perpendicularly or at least virtually perpendicularly.

The optical element is preferably produced using an injection molding method. In this way, the optical element can be fabricated in a comparatively cost effective fashion in large production quantities. The use of injection molding methods in the fabrication of illuminating units is described in more detail in publications WO 2006/012834 A2 and DE 102005005265 A1, for example, the content of both of which is hereby incorporated by reference.

The holographic element can include a recording of a three dimensional graphic object that is reproduced during operation of the illuminating unit. For example, the three dimensional graphic object can be an indication of the manufacturer, for example a company logo. Furthermore, it is possible for the three dimensional graphic object to include a security feature. Here, a security feature is understood as a graphic element with the aid of which it can be recognized whether an original part is present, thus rendering imitation by unauthorized persons difficult. The security feature can be visible to a viewer of the illuminating unit, for example, a serial number, or preferably be invisible, for example as in the case of a concealed modulation of individual image regions.

In one preferred embodiment, the illuminating unit is a motor vehicle headlight. The beam shape required for the motor vehicle headlight can advantageously be attained by means of the holographic element included in the optical element. In particular, the holographic element can be designed in such a way that the motor vehicle headlight has an asymmetric beam shape.

In another preferred embodiment, the optical element includes a switchable diffractive optical element. The switchable diffractive optical element can, in particular, be an SLM (Spatial Light Modulator). Such switchable diffractive optical elements are also used, for example, in projectors (beamers). In particular, the switchable diffractive element can be a micro liquid crystal display (LCD) in which the gray scale value of the liquid crystals contained in the LCD can be varied pixel by pixel. It is possible in this way to vary the amplitude of the light passing through or, on the basis of the birefringent properties of the liquid crystal, also to vary the phases of the light passing through. In particular, the switchable diffractive element can thus be a holographic element calculated by means of a computer.

The switchable diffractive optical element is, for example, connected to a computer that calculates during operation a diffraction structure, suitable for the respective illuminating goal, of the switchable diffractive optical element, or to control electronics by means of which patterns calculated and stored in advance are set. By contrast with conventional lens systems, the beam shape of the luminous means can in this way be modified not only spatially, but also temporally.

In particular, the beam shape of a motor vehicle headlight can be adapted to the respective driving situation by a switchable diffractive element. For example, the spatial intensity distribution can be varied during cornering of the motor vehicle.

DETAILED DESCRIPTION OF THE DRAWINGS

Figure 1:
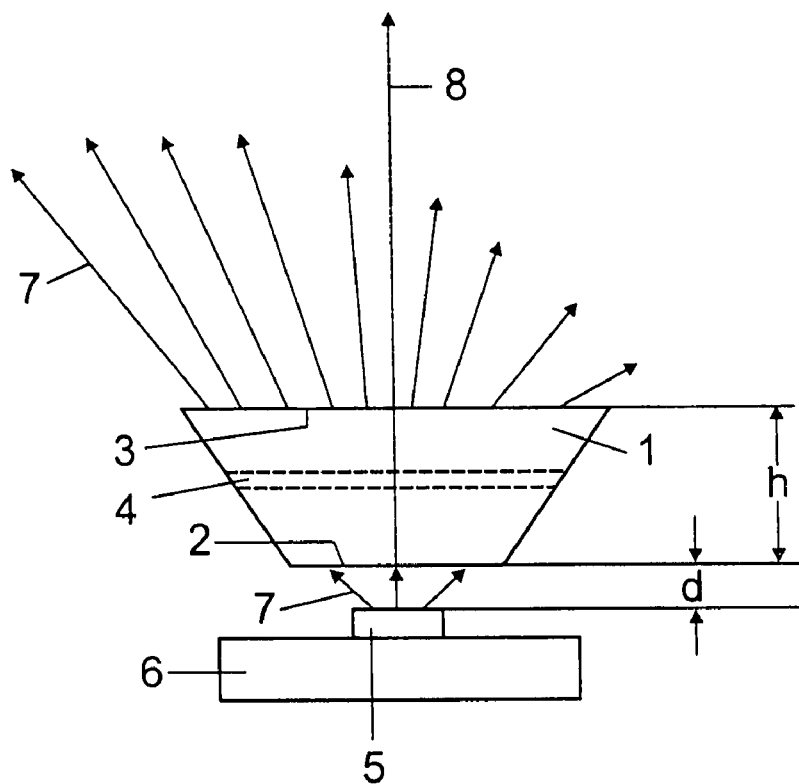
FIG. 1 shows a schematic graphic illustration of a cross section through an illuminating unit in accordance with a first exemplary embodiment of the invention.

Identical or identically acting elements are provided with identical reference numerals in the figures. The elements illustrated are not to be regarded as true to scale, rather it is possible for individual elements to be illustrated oversized for the purpose of better understanding.

The illuminating unit illustrated in FIG. 1 includes an LED 5 as luminous means. An optical element 1 is arranged downstream of the LED 5 in a main beam direction 8. Formed in the optical element 1 is a holographic element 4 which is, for example, a volume hologram arranged in the interior of the beam shaping element.

The optical element 1 has a radiation entrance surface 2 that faces the LED 5 and at which the radiation 7 emitted from the LED 5 enters the optical element 1. The optical element 1 has a radiation exit surface 3 on a side averted from the LED 5. The holographic element 4 included in the optical element 1 functions as a lens for the radiation 7 emitted from the LED 5.

As a result of the lens function of the holographic element 4, the radiation 7 emitted from the LED 5 leaves the radiation exit surface 3 of the optical element 1 with a desired intensity distribution and angular distribution.

It is advantageously possible to use the holographic element 4 to produce beam profiles that can be implemented with the aid of conventional optical elements only with difficulty and/or with comparatively complex systems that require a relatively large overall height.

The holographic element 4 is preferably designed in such a way that, as indicated in FIG. 1, a light distribution is attained that is asymmetric relative to the main beam direction 8. Such an asymmetric light distribution is desired in the case of motor vehicle headlights, for example.

Furthermore, a beam expansion of the radiation emitted from the LED 5 is attained by means of the holographic element 4. This is desirable, in particular, for high power LEDs, since these have a very high luminous density because of the comparatively small emission surface of the radiation emitting semiconductor chip of typically 1 mm$^2$ or less, as a result of which an effect of glare could arise without an element for beam expansion.

The design of the holographic element 4 as volume hologram in the optical element 1 has the advantage that the holographic element 4 is protected against environmental influences, in particular against dirt, moisture or mechanical damage.

The holographic element 4 is arranged, for example, in the form of a layer in the optical element 1 or on the optical element 1. The fabrication of the volume hologram shaped as a layer can be performed by producing holographic interference patterns in a photosensitive layer by exposure. For example, a laser beam can be split in a conventional way and one partial beam is guided onto an object, in particular a lens system, while the other partial beam is guided directly onto the holographic film material. The partial beams are superposed in the photosensitive material, resulting in the formation of interference patterns that reconstruct the object again upon a subsequent illumination with the same wavelength. The hologram then takes on the function of the lens system. Depending on the design of the hologram, it influences the phases and/or the amplitudes of the light upon transmission. In particular, hologram variants that are suitable for illumination with white light are also known.

The hologram produced in a photosensitive layer with the aid of the described method can be duplicated cost effectively using a contact copying method, for example, such that copies of an original hologram can advantageously be used when fabricating the optical element 1 in large production quantities.

Furthermore, the hologram can also be a computer generated hologram that can advantageously be used to attain more complex effects than by conventional working with real objects. Computer generated holograms are, for example, exposed pixel by pixel by a laser beam or an electron beam. In this form of holography, the original part to be imaged, for example a lens system, need not actually be present, but is only a computer model.

The holographic element 4 advantageously includes a recording of a three dimensional graphic object that is reproduced during operation of the illuminating unit. The three dimensional graphic object can be seen by a viewer during operation of the illuminating unit, for example in a fashion floating in front of the illuminating unit, without the light flux otherwise being disturbed thereby. The three dimensional graphic object is, for example, an indication of the manufacturer of the illuminating unit, for example the company name or a company logo. In particular, the three dimensional graphic object can also include security features that render an imitation of the optical element difficult, for example identification numbers or preferably features invisible to the viewer such as, for example, an intensity modulation not perceptible to the human eye.

In order to embed the three dimensional graphic object in the holographic element 4, the holographic element 4 is preferably fabricated as a computer generated hologram. In particular, it is also possible to insert into the holographic element 4 a graphic object that includes shapes or patterns that are used, for example, for the purpose of decorative illumination.

The optical element 1 is distinguished from conventional optical elements, for example from conventional lens systems or reflectors, by a comparatively low height h. In particular, the optical element 1 can have a height h of less than 8 mm, preferably of less than 5 mm, and particular preferably of less than 3 mm.

A low height h of the optical element 1 can be attained, in particular, by virtue of the fact that the radiation exit surface 3 and/or the radiation entrance surface 2 is substantially flat. With particular preference, both the radiation entrance surface 2 and the radiation exit surface 3 are respectively flat surfaces.

Furthermore, in order to attain a low overall height of the illuminating unit it is advantageous when the distance d between the luminous means 5 and the radiation entrance surface 2 of the optical element is d=1 mm or less. Such a small distance between the luminous means 5 and the optical element 1 cannot be directly implemented with the aid of conventional lens systems, because of the generally excessively large focal length of the lenses. A slight distance between the luminous means 5 and the radiation entrance surface 2 has the advantage, furthermore, that even radiation 7 emerging from the luminous means at a flat angle enters the radiation entrance surface, and thus is not lost by lateral emission.

The LED 5 can be an LED chip without a housing, which is mounted on a substrate 6 or, alternatively, an LED chip mounted in an LED housing (not illustrated). Instead of an individual LED chip 5, it is, alternatively, also possible to arrange a plurality of LED chips on the substrate 6 or in an LED housing.

The substrate 6 is preferably a chip substrate made from a ceramic such as, for example, AlN, which is suitable for dissipating the heat produced by the LED chip 5. The substrate 6 can, for example, also be a printed circuit board.

In particular, the LED 5 can have a light emitting semiconductor chip made from a III-V compound semiconductor material, for example a nitride compound semiconductor material. For example, the semiconductor chip can have semiconductor layers made from $Al_xGa_yIn_{1-x-y}N$, in which case it holds that $0 \leq x \leq 1$, $0 \leq y \leq 1$ and $x+y \leq 1$. Here, this material need not necessarily exhibit a mathematically exact composition according to the above formula. Rather, it can have one or more dopants as well as additional components. For the sake of simplicity, however, the above formula includes only the essential components of the crystal lattice (Al, Ga, In, N), even when these can be replaced in part by small quantities of further substances.

Furthermore, the luminous means 5 can also be an organic light emitting diode (OLED), or another punctiform or planar luminous means.

The luminous means 5 is preferably a white light emitting LED chip. The emission of white light can be implemented, for example, in such a way that there is arranged downstream of a semiconductor chip made from a nitride compound semiconductor material, which has an emission maximum in the ultraviolet or blue spectral region, a luminescence conversion layer that converts a portion of the radiation emitted from the semiconductor chip into the complementary spectral region. The luminescence conversion layer can, for example, be applied to the LED chip 5 or to a surface of the optical element 1.

A white light emitting luminous means 5 can also be implemented by additive color mixing of the radiation from a plurality of individual light sources, in particular the radiation from a plurality of LED chips. For example, the colors blue and yellow or the colors red, green and blue can be superposed to form white light. In this case, the holographic element 4 can serve to superpose the beams of the LEDs of different color, and to mix the colors in this way. The LED chips of the different colors are preferably arranged in a matrix.

Figure 2:
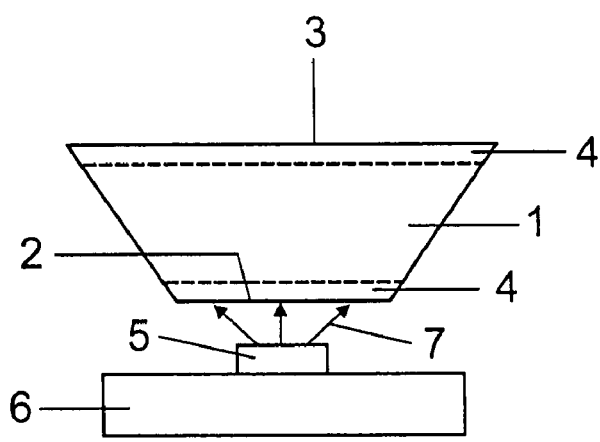
FIG. 2 shows a schematic graphic illustration of a cross section through an illuminating unit in accordance with a second exemplary embodiment of the invention.

In the case of the exemplary embodiment, illustrated in FIG. 2, of an illuminating unit in accordance with the invention, by comparison with the first exemplary embodiment the optical element 1 has no volume hologram, but respectively a surface hologram 4 on the radiation entrance surface 2 and on the radiation exit surface 3.

The surface holograms 4 on the radiation entrance surface 2 and the radiation exit surface 3 are preferably surface relief holograms. The optical element 1 with the surface relief holograms 4 is preferably fabricated using an injection molding method. In this way, the optical element 1 can be produced with a comparatively low outlay on fabrication, and this enables cost effective mass fabrication.

The holographic elements 4 need not necessarily be formed both on the radiation entrance surface 2 and on the radiation exit surface 3. Rather, it is also possible to provide only the radiation entrance surface 2 with a holographic element 4, or only the radiation exit surface 3 with a holographic element 4.

Figure 3:
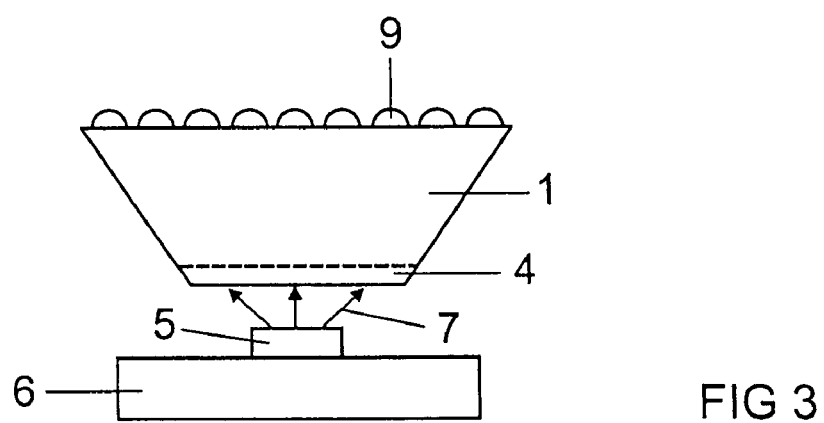
FIG. 3 shows a schematic graphic illustration of a cross section through an illuminating unit in accordance with a third exemplary embodiment of the invention.

Illustrated in FIG. 3 is an exemplary embodiment in which the optical element 1 has a holographic element 4, in particular a surface relief hologram, on the radiation entrance surface 2. By contrast with the previously described exemplary embodiment, it is not a holographic element that is arranged on the radiation exit surface 3, but a refractive microoptical structure, specifically a microlens array 9.

Apart from the microoptical structure 9, the radiation exit surface 3 has no curvature, and so both the radiation entrance surface 2 and the radiation exit surface 3 are substantially flat surfaces in the case of this exemplary embodiment, as well. As an alternative to the exemplary embodiment illustrated in FIG. 3, it would also be possible to form a microoptical structure, in particular a microlens array or a microprism structure, on the radiation entrance surface 2, and to arrange the holographic element 4 on the radiation exit surface 3. Likewise, the embodiment, previously described in conjunction with FIG. 1, comprising a volume hologram can be combined with a microoptic structure on the radiation entrance surface and/or the radiation exit surface.

In order to reduce reflection losses in the radiation, emitted from the luminous means 5, at the radiation entrance surface 2 and/or at the radiation exit surface 3, the radiation entrance surface 2 and/or the radiation exit surface 3 are preferably provided with a reflection reducing coating 10.

Figure 4:
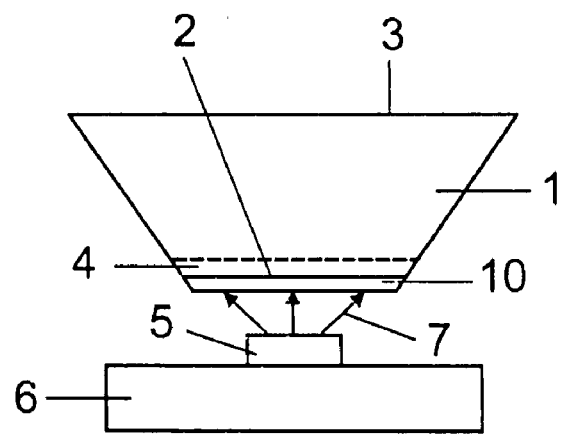
FIG. 4 shows a schematic graphic illustration of a cross section through an illuminating unit in accordance with a fourth exemplary embodiment of the invention.

For example, in the case of the exemplary embodiment illustrated in FIG. 4 the radiation entrance surface 2 has a reflection reducing coating 10. In particular, the reflection reducing coating 10 can also be a multilayer coating.

Figure 5:
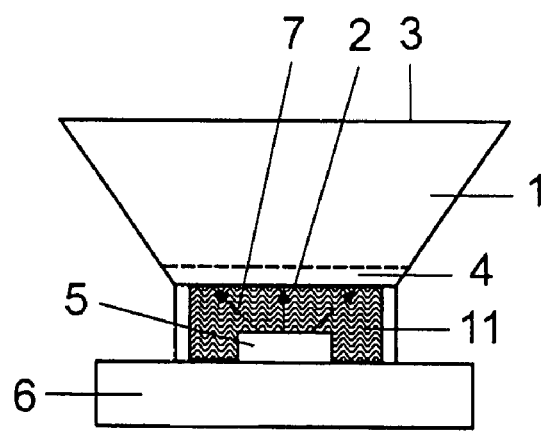
FIG. 5 shows a schematic graphic illustration of a cross section through an illuminating unit in accordance with a fifth exemplary embodiment of the invention.

A further possibility for reducing reflection losses at the radiation entrance surface 2 is illustrated in FIG. 5. In this exemplary embodiment, the interspace between the LED 5 and the radiation entrance surface 2 of the optical element 1 is filled with an immersion liquid 11. The immersion liquid 11 preferably has a similar refractive index to the optical element 1.

Figure 6:
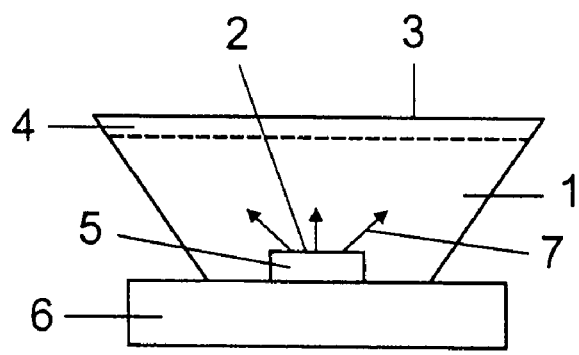
FIG. 6 shows a schematic graphic illustration of a cross section through an illuminating unit in accordance with a sixth exemplary embodiment of the invention.

In the case of the exemplary embodiment illustrated in FIG. 6, the LED chip 5 is enclosed by the optical element 1. This can be done, for example, by applying the optical element 1 to the LED 5 arranged on the substrate 6 using an injection molding method. The optical element 1 has, for example, a surface relief hologram 4 on the radiation exit surface 3, which is likewise produced using the injection molding method. By embedding the LED chip 5 in the optical element 1, reflection losses are likewise reduced upon entry of the radiation emitted from the LED chip 5 into the optical element 1.

Figure 7:
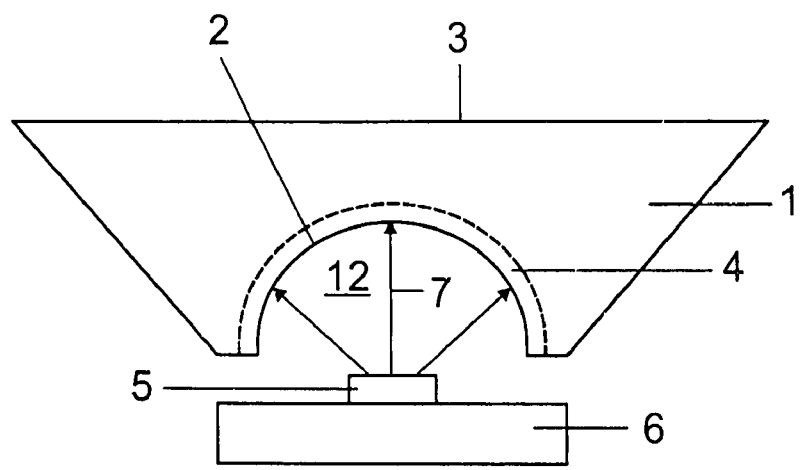
FIG. 7 shows a schematic graphic illustration of a cross section through an illuminating unit in accordance with a seventh exemplary embodiment of the invention.

Furthermore, reflection losses at the radiation entrance surface 2 can be reduced by virtue of the fact, as illustrated in FIG. 7, the radiation entrance surface 2 has a cutout 12 that faces the luminous means 5 such that the light beams 7 emitted from the luminous means 5 strike the radiation entrance surface 2 at a small incidence angle. For example, in this exemplary embodiment the cutout 12 has a concave curvature facing the LED 5. In particular, the cutout 12 in the optical element 1 can be hemispherical. The holographic element 4 is, for example, arranged as a surface hologram in the region of the cutout 12 on the radiation entrance surface 2.

Figure 8:
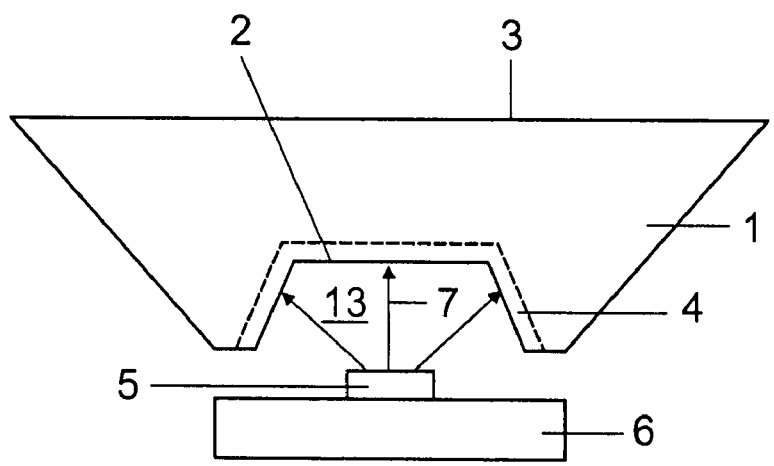
FIG. 8 shows a schematic graphic illustration of a cross section through an illuminating unit in accordance with an eighth exemplary embodiment of the invention.

In the case of the exemplary embodiment illustrated in FIG. 8, as well, the optical element 1 has a cutout 13 that in this case has a shape of a conical frustum. This advantageously prevents the light beams emitted from the LED chip 5 from striking the radiation entrance surface 2 of the optical element 1 at a large incidence angle. As in the case of the previously described exemplary embodiment, the holographic element 4 is, for example, arranged as a surface hologram in the region of the cutout 13 on the radiation entrance surface 2.

Figure 9:
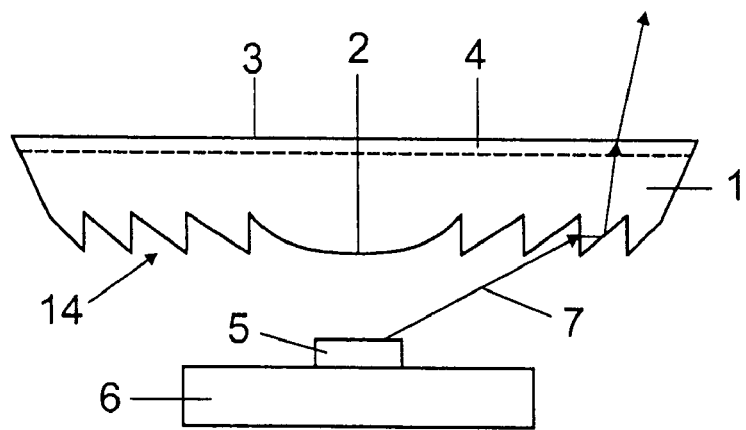
FIG. 9 shows a schematic graphic illustration of a cross section through an illuminating unit in accordance with a ninth exemplary embodiment of the invention.

In the case of the exemplary embodiment illustrated in FIG. 9, the radiation entrance surface 2 of the optical element 1 has a Fresnel lens structure 14. The Fresnel lens structure 14 advantageously has the effect that a light beam 7 striking the radiation entrance surface 2 at a flat angle does not, owing to internal total reflection, emerge laterally from the optical element 1, but is reflected toward the radiation exit surface 3. The holographic element 4 is arranged on the radiation exit surface 3 in this exemplary embodiment.

Figure 10:
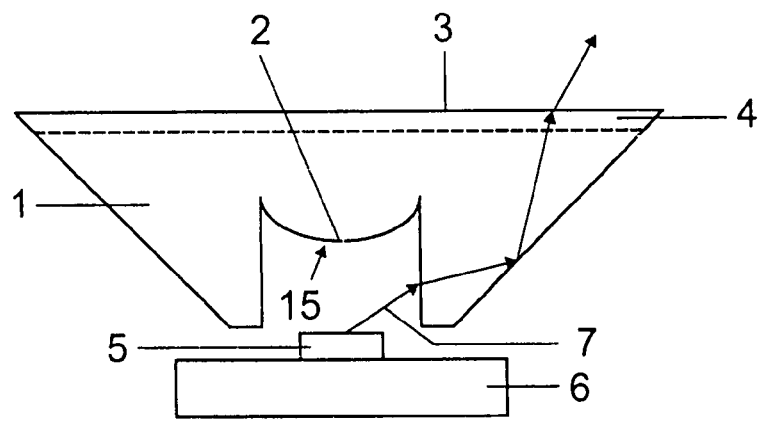
FIG. 10 shows a schematic graphic illustration of a cross section through an illuminating unit in accordance with a tenth exemplary embodiment of the invention.

In the case of the exemplary embodiment illustrated in FIG. 10, the radiation entrance surface 2 of the optical element 1 has a TIR lens structure 15. In the case of this embodiment, as well, a light beam 7 emerging from the LED 5 at a flat angle is reflected by internal total reflection inside the optical element 1 onto the radiation exit surface 3. The holographic element 4 is arranged on the flat radiation exit surface 3, for example.

Figure 11:
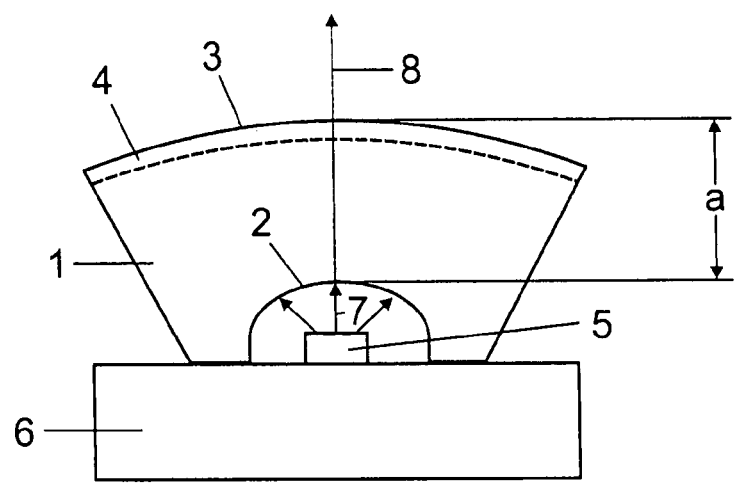
FIG. 11 shows a schematic graphic illustration of a cross section through an illuminating unit in accordance with an eleventh exemplary embodiment of the invention.

FIG. 11 illustrates an exemplary embodiment in the case of which the optical element 1 has both a curved radiation entrance surface 2 and a curved radiation exit surface 3. For example, the radiation exit surface 3 can be provided with a holographic element 4. The macroscopic shape of the optical element 1, which would have a lens function even without the holographic element 4, is to be taken into account when calculating the holographic element 4, which is preferably a computer generated hologram. The holographic element 4 can be used to attain beam shapes that could not be attained straight away solely with the macroscopic lens function of the optical element 1. Because of the additional lens function of the holographic element 4, a lower overall height is advantageously achieved than would be necessary in the case of a conventional lens system for attaining the same beam profile. In particular, a distance a that is covered by a light beam 7, emitted in a main beam direction 8, between the curved radiation entrance surface 2 and the curved radiation exit surface 3, is comparatively small.

Figure 12:
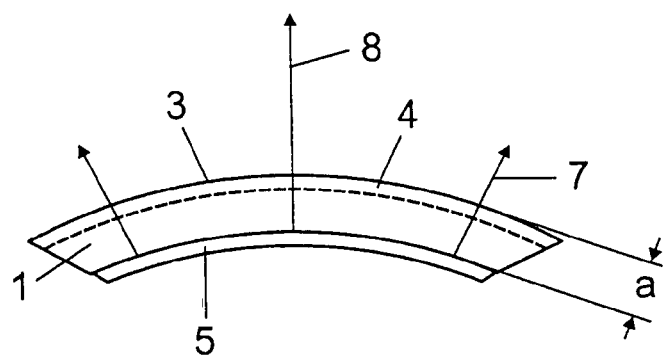
FIG. 12 shows a schematic graphic illustration of a cross section through an illuminating unit in accordance with a twelfth exemplary embodiment of the invention.

The luminous means 5 is not necessarily an LED chip mounted on a substrate. For example, in the case of the exemplary embodiment illustrated in FIG. 12 the luminous means 5 is an organic light emitting diode (OLED) emitting in a planar fashion and which is arranged, for example, directly on the radiation entrance surface 2 of an optical element 1. In this case, a surface hologram 4 is arranged on the radiation exit surface 3, for example. By contrast with conventional lens systems, a distance a covered by a light beam 7 between the radiation entrance surface 2 and the radiation exit surface 3 of the optical element 1 is comparatively small, and so the illuminating unit has an advantageously low overall height.

Figure 13:
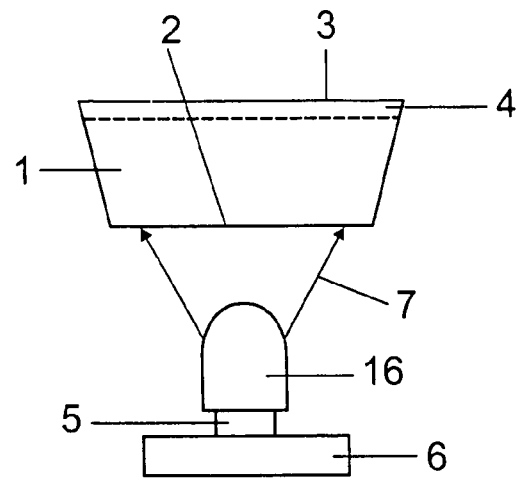
FIG. 13 shows a schematic graphic illustration of a cross section through an illuminating unit in accordance with a thirteenth exemplary embodiment of the invention.

In the case of the exemplary embodiment illustrated in FIG. 13, the illuminating unit includes an LED chip 5 downstream of which there are arranged in the direction of the emission of the emitted radiation 7 a lens 16 and an optical element 1 with a holographic element 4. Thus, the lens 16 acts as primary optics, and the optical element 1 acts as secondary optics for the radiation emitted from the LED chip 5. The lens 16 is preferably designed in such a way that it reduces the beam divergence of the emitted radiation so that the radiation of the LED chip 5 strikes the radiation entrance surface 2 of the optical element 1 at a small incidence angle. Reflection losses at the radiation entrance surface 2 are thereby advantageously reduced.

The lens 16 can consist, for example, of a glass or a plastic. It can, in particular, have a convex curvature facing the optical element 1. The lens 16 can be spherically or aspherically curved.

Figure 14:
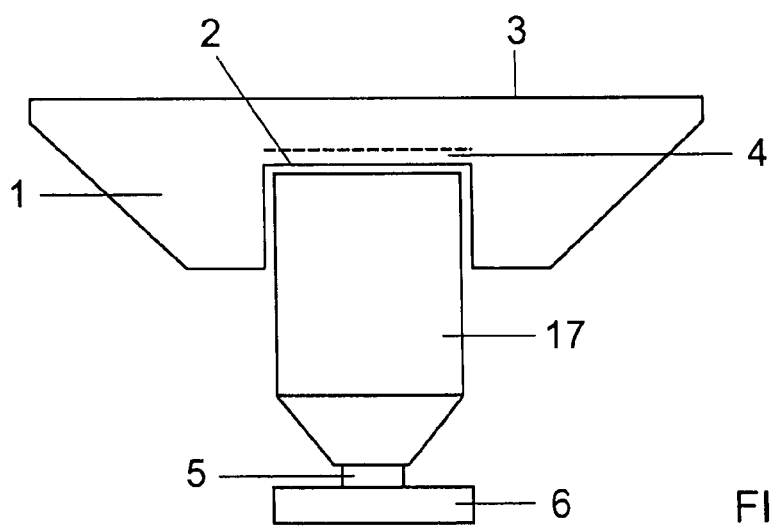
FIG. 14 shows a schematic graphic illustration of a cross section through an illuminating unit in accordance with a fourteenth exemplary embodiment of the invention.

A further exemplary embodiment, in the case of which a primary optics and an optical element 1 as secondary optics are arranged downstream of an LED chip 5 is illustrated in FIG. 14. In the case of this exemplary embodiment, the primary optics is a light guide 17 that guides the radiation emitted from the LED chip 5 to the optical element 1. The light guide 17 extends in this case from the LED chip 5 as far as into a cutout in the optical element 1. The light beams guided in the light guide 17 to the optical element 1 advantageously enter the radiation entrance surface 2 of the optical element 1 at small incidence angles. Thus, reflection losses upon entry of the radiation into the radiation entrance surface are also advantageously reduced in the case of this exemplary embodiment. The holographic element 4 is, for example, arranged on the beam entrance surface 2 of the optical element 1.

Figure 15:
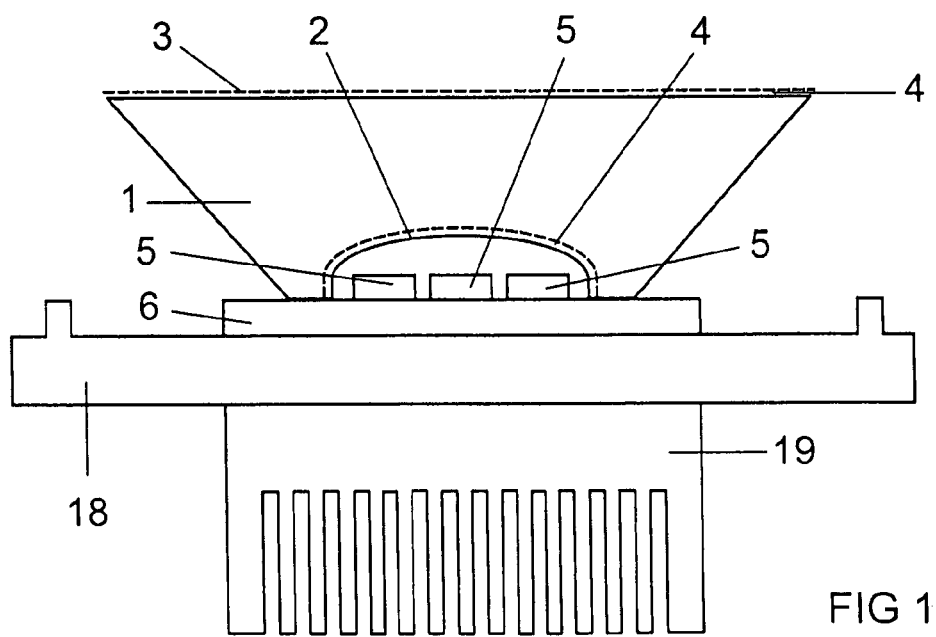
FIG. 15 shows a schematic graphic illustration of a cross section through an illuminating unit in accordance with a fifteenth exemplary embodiment of the invention.

In the case of the exemplary embodiment of an illuminating unit illustrated in FIG. 15, which can be a motor vehicle headlight, in particular, the luminous means is formed from a plurality of LED chips 5. The LED chips 5 are arranged, for example, on a common chip substrate 6. The chip substrate 6 rests on a base 18 that functions as a lamp holder.

In order to dissipate heat produced by the LED chips 5, a heat sink 19 is provided that has, for example, a multiplicity of cooling ribs. Alternatively, the heat sink 19 could also be an actively cooled heat sink 19 that has microchannels through which liquid flows.

For the purpose of beam shaping the radiation emitted from the LED chips 5, the illuminating unit includes an optical element 1 that, for example, respectively has a holographic element 4 on the radiation entrance surface 2 and on the radiation exit surface 3. The optical element 1 lies on the chip substrate 6, the LED chips 5 being arranged in a cutout, facing the chip substrate 6, in the optical element 1. The chip substrate 6 is preferably a metal-core circuit board. A desired light distribution can advantageously be set by means of the holographic elements 4. In particular, by varying the holographic elements 4 it is possible to vary the light distribution without a variation in the outline of the optical element 1. This has the advantage that it is possible to use a standardized optical element for various illumination purposes.

Figure 16:
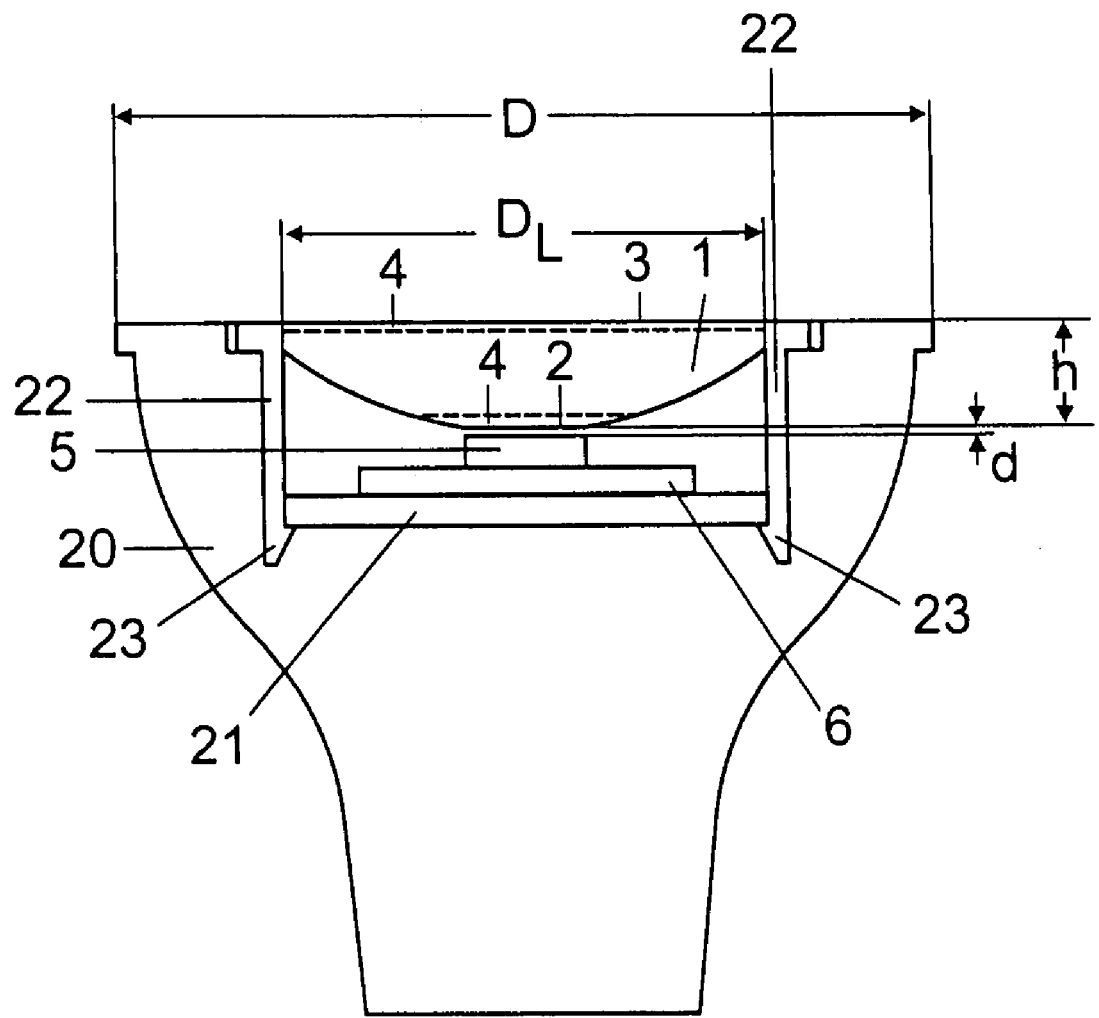
FIG. 16 shows a schematic graphic illustration of a cross section through an illuminating unit in accordance with a sixteenth exemplary embodiment of the invention.

In the case of the exemplary embodiment illustrated in FIG. 16, the illuminating unit is installed in a housing 20 that has the dimensions of a conventional reflector lamp. The luminous means 5 is an LED, for example an LED chip arranged in an LED housing. The LED 5 is arranged on a substrate 6, preferably a metal-core circuit board. As an alternative to an LED chip mounted in a LED housing, the luminous means 5 can also be formed from one or more LED chips without a housing, that is to say from LED chips mounted directly on the substrate 6.

The illuminating unit has an optical element 1 for beam shaping the radiation emitted from the luminous means 5. The optical element 1 respectively has, for example, a holographic element 4 both on the radiation entrance surface 2 and on the radiation exit surface 3. In particular, the optical element 1 can be an element made from a plastic and preferably produced using an injection molding method. The holographic elements 4 are advantageously designed as surface relief holograms and can therefore be fabricated cost effectively with comparatively little outlay on fabrication using the injection molding method. Alternatively, it is also possible to provide a volume hologram in the optical element 1.

In the exemplary embodiment, the optical element 1 has a height h of only approximately 7.5 mm such that the overall height of the illuminating unit is advantageously low. Furthermore, it is advantageous for the overall height of the illuminating unit that the distance d between the luminous means 5 and the radiation entrance surface 2 of the optical element 1 is only approximately 0.5 mm.

A diameter D of the lamp housing 20 is, for example, approximately 50 mm, and this corresponds to the diameter of an embodiment of a reflector lamp for general illuminating purposes.

The optical element 1 advantageously has at least two support elements 22 that are integrally formed on the outsides and serve for holding the optical element 1 in the lamp housing 20. The support elements 22 preferably respectively have snap action feet 23 that engage under a substrate 21 on which, for example, the metal core printed board 6 is arranged. The optical element 1 is therefore advantageously easy to mount and replace. The radiation exit surface 3 of the optical element 1 has a diameter $D_L$ of, for example, 29 mm. The height of the optical element 1 is therefore advantageously only approximately ¼ of the optically active radiation exit surface 3.

Figure 17A:
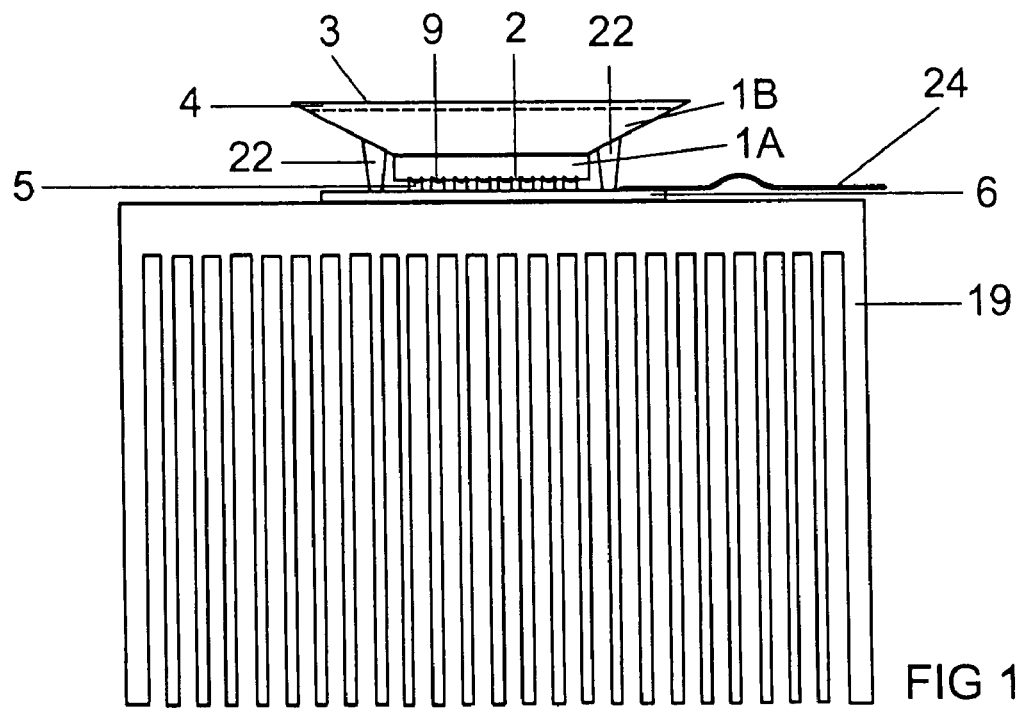
FIG. 17A shows a schematic graphic illustration of a cross section through an illuminating unit in accordance with a seventeenth exemplary embodiment of the invention.
Figure 17B:
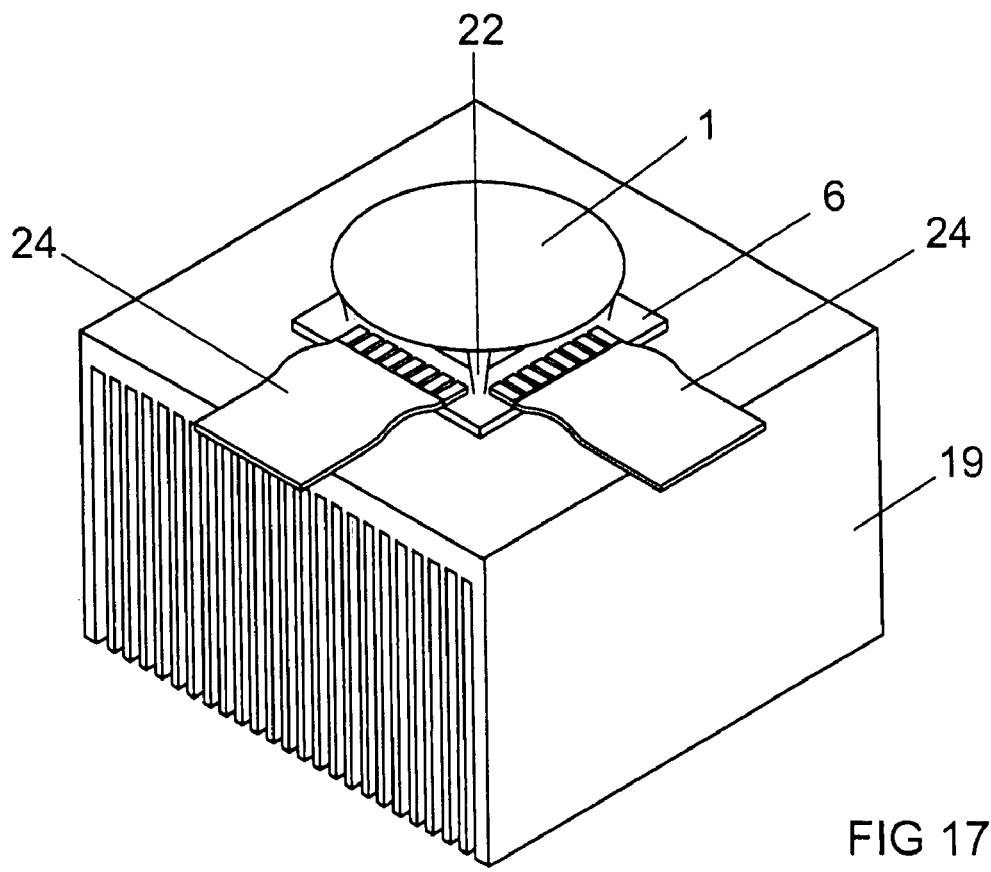
FIG. 17B shows a schematic perspective illustration of an illuminating unit in accordance with the seventeenth exemplary embodiment of the invention.

FIGS. 17A and 17B illustrate an exemplary embodiment of the invention schematically in cross section and in a perspective illustration from above in which the luminous means is formed from a multiplicity of LED chips 5 arranged, in the form of a matrix. For example, the matrix can include 8×8 LED chips. Electrical contact is made with the LED chips 5 via connecting lines 24, and they can preferably be driven individually. In this case, the emission characteristic of the illuminating unit can advantageously be varied by switching individual LED chips 5 on or off, or dimming them.

In the case of this exemplary embodiment, the optical element 1 is designed in two parts composed of a lower part 1A and an upper part 1B. The lower part 1A includes the radiation entrance surface 2 on which, for example, there is formed a microstructure 9, for example in the form of microlenses or microprisms. For example, each of the LED chips 5 arranged in the matrix can be assigned a microlens 9 or a microprism. The upper part 1B of the optical element 1 is used to perform a further modification of the radiation emitted from the LED matrix, in order to attain a desired beam shape. For example, the upper part 1B, which in the case of this exemplary embodiment has a holographic element 4 on the radiation exit surface 3, is used to reduce the divergence of the beam and/or to diminish color fringes possibly occurring by means of targeted additive color mixing.

The LED matrix 5 is advantageously mounted on a substrate 6 that has good thermal conductivity. For example, the substrate 6 can contain aluminum nitride. The substrate 6 can, in particular, be mounted on a heat sink 19 or, for example in the case of a motor vehicle headlight, be connected to the body.

The bipartite optical element 1 is advantageously fabricated from plastic using the injection molding method. The optical element 1 has support elements 22 for fastening on the substrate 6. The support elements 22 are preferably already integrally formed on the optical element 1 using the injection molding method.

The LED chips 5 included in the LED matrix can emit light of various colors. For example, it may be a case of blue and yellow emitting LED chips or of red, green and blue emitting LED chips, their radiation being superposed to form white light. Alternatively, however, it is also possible to produce a colored light beam, or a light beam which has a color that can be varied.

Figure 18A:
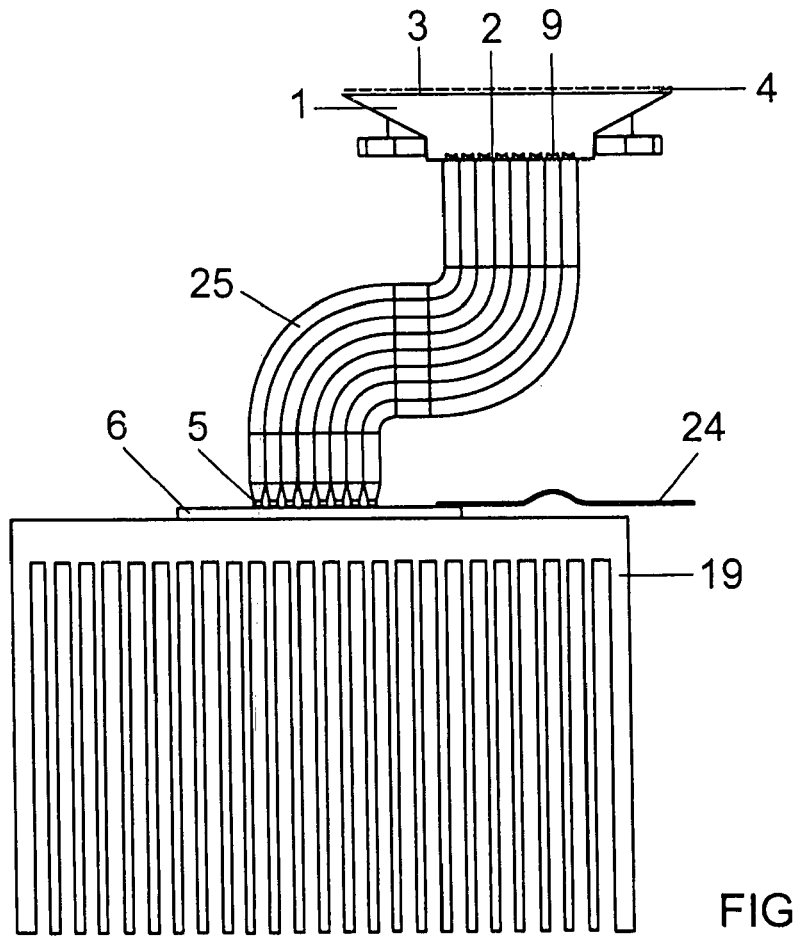
FIG. 18A shows a schematic graphic illustration of a cross section through an illuminating unit in accordance with an eighteenth exemplary embodiment of the invention.
Figure 18B:
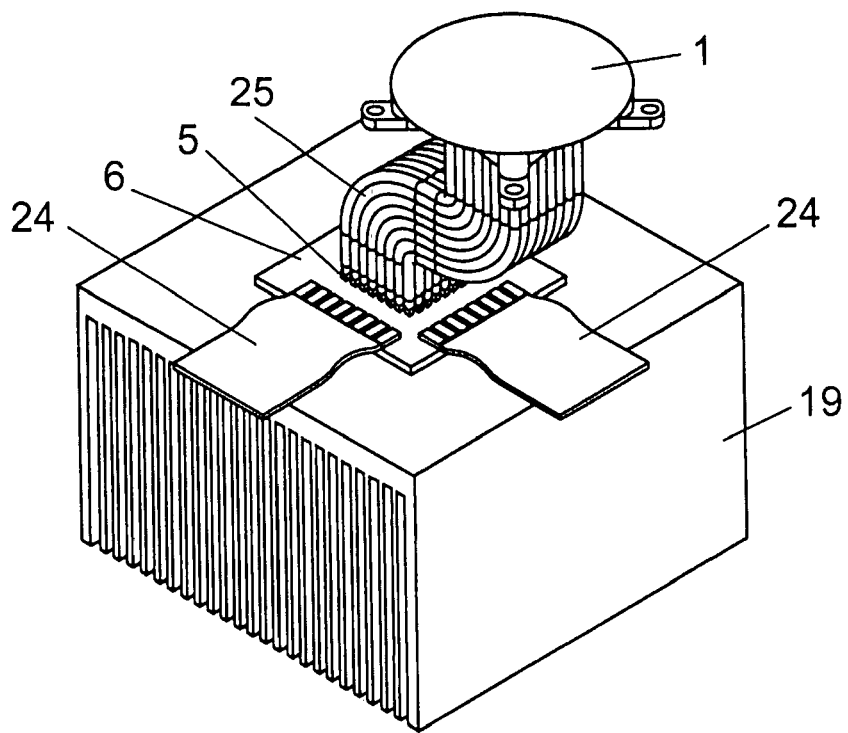
FIG. 18B shows a schematic perspective illustration of an illuminating unit in accordance with an eighteenth exemplary embodiment of the invention.

The exemplary embodiment illustrated in FIGS. 18A and 18B in cross section and in a perspective view from above differs from the exemplary embodiment illustrated in FIGS. 17A and 17B in that the optical element 1 is not positioned directly over the LED matrix. Rather, each LED chip 5 is assigned a dedicated light guide 25 with the aid of which the radiation of the respective LED chip 5 is guided to the optical element 1. In this way, the radiation of each individual LED chip 5 is advantageously guided to a predetermined location on the radiation entrance surface 2 of the optical element 1.

Otherwise, the exemplary embodiment illustrated in FIGS. 18A and 18B corresponds to the exemplary embodiment illustrated in FIGS. 17A and 17B.

Figure 19A:
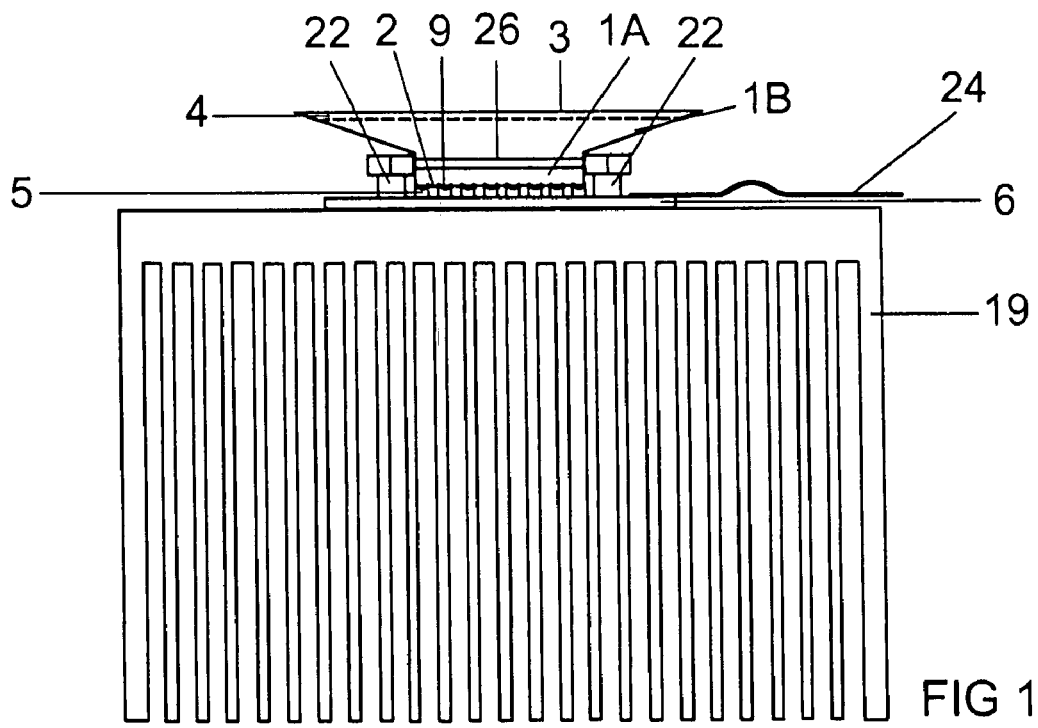
FIG. 19A shows a schematic graphic illustration of a cross section through an illuminating unit in accordance with a nineteenth exemplary embodiment of the invention.
Figure 19B:
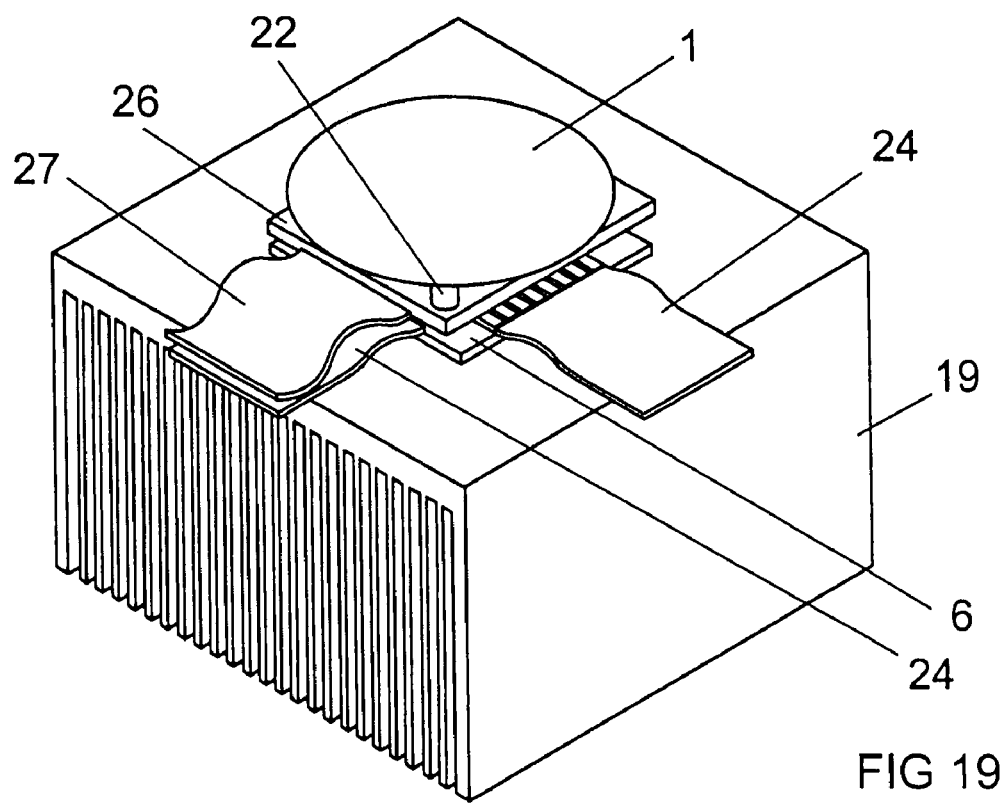
FIG. 19B shows a schematic perspective illustration of an illuminating unit in accordance with the nineteenth exemplary embodiment of the invention.

An exemplary embodiment of the invention is illustrated in FIGS. 19A and 19B in cross section and in a perspective view from above in which there is a further modification of the exemplary embodiment illustrated in FIGS. 17A and 17B. By contrast with the exemplary embodiment illustrated in FIGS. 17A and 17B, the optical element 1 is of tripartite design in this case. The optical element 1 includes a lower part 1A and an upper part 1B that are, for example, designed as in the case of the exemplary embodiment illustrated in FIGS. 17A and 17B. In particular, the lower part 1A can have a microlens structure 9, and the upper part 1B a holographic element 4.

A switchable diffractive element 26 (SLM, Spatial Light Modulator) is arranged between the lower part 1A and the upper part 1B of the optical element 1. Such switchable diffractive optical elements are also used, for example, in projectors (beamers). In particular, the switchable diffractive element 26 can be a micro-liquid crystal display (LCD) in the case of which the gray scale value of the liquid crystals contained in the LCD can be varied. It is possible in this way to vary the amplitude of the light passing through, or else to vary the phases of the light passing through on the basis of the birefringent properties of the liquid crystal. Disadvantageous optical properties of such switchable optical elements that result, for example, from a comparatively large pixel size of approximately 10 μm, can advantageously be corrected by a holographic element 4 included in the upper part 1B of the optical element 1. In particular, it is also advantageous that the divergence of the light beams emerging from the light matrix 5 is already decreased by the static optics included in the lower part 1A of the optical element 1, for example a microlens array 9, before the light beams enter the switchable diffractive optical element 26.

The switchable diffractive optical element 26 is connected by means of a control line 27, for example to a computer that during operation calculates a diffractive structure, suitable for the respective illuminating purpose, of the switchable diffractive optical element 26, or to control electronics by means of which patterns calculated and stored in advance are set.

Figure 20:
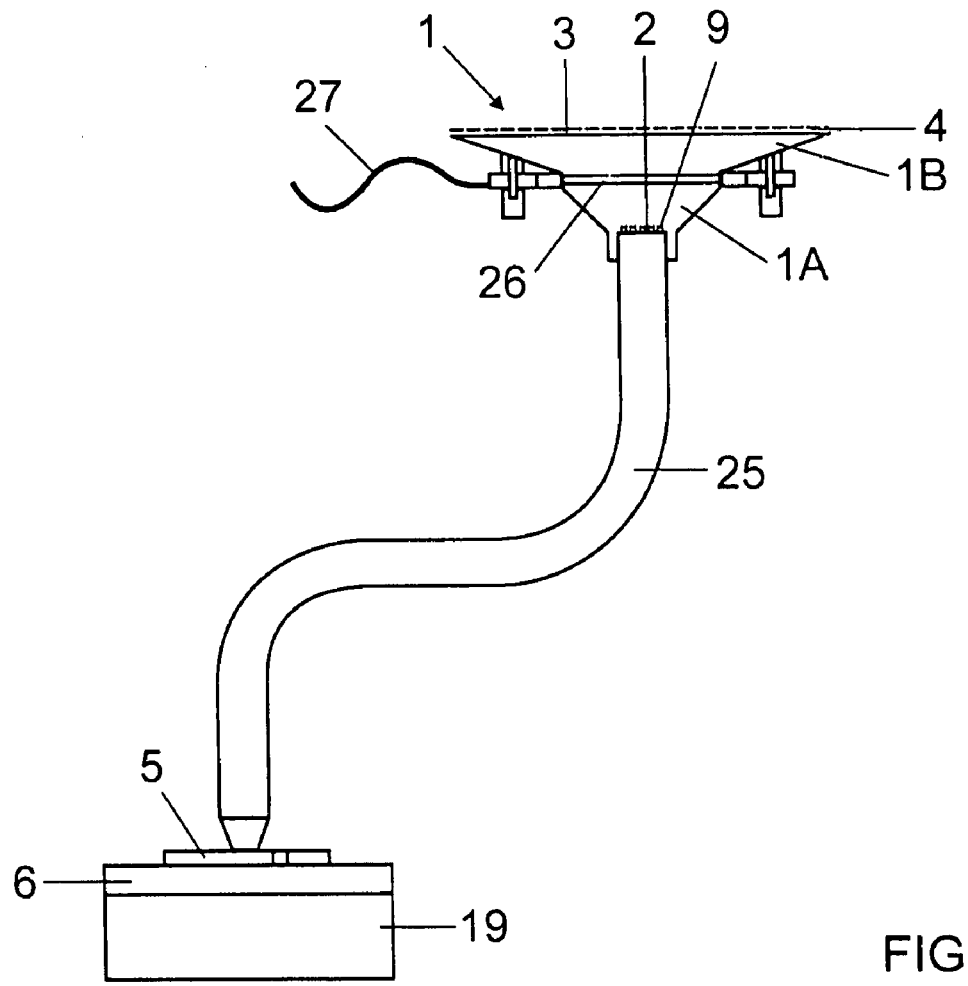
FIG. 20 shows a schematic graphic illustration of a cross section through an illuminating unit in accordance with a twentieth exemplary embodiment of the invention.

In the case of the exemplary embodiment illustrated in FIG. 20, the luminous means 5 is a LED module. The LED module can include one or more LED chips. The LED module is connected to the radiation entrance surface 2 of an optical element 1 via an individual light guide 25. As in the case of the previously described exemplary embodiment, the optical element 1 is of tripartite design. It includes an upper part 1B that has a holographic element 4 on the radiation exit surface 3, a lower part 1A that includes further static optics, for example a microlens structure 9 on the radiation entrance surface 2, and a switchable diffractive element 26 arranged between the lower part 1A and the upper part 1B.

The LED module 5 is arranged on a substrate 6 that is preferably connected to a heat sink 19. Otherwise, this exemplary embodiment corresponds to the previously described exemplary embodiment, particularly with regard to the function of the tripartite optical element 1.

Figure 21:
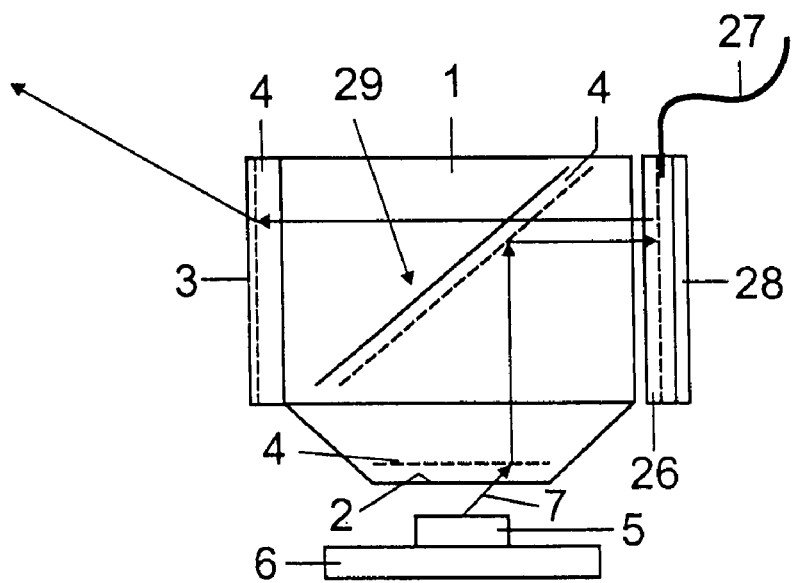
FIG. 21 shows a schematic graphic illustration of a cross section through an illuminating unit in accordance with a twenty first exemplary embodiment of the invention.

As in the case of the two previously described exemplary embodiments, in the case of the exemplary embodiment described in FIG. 21 the optical element 1 includes a switchable diffractive element 26. In the case of this exemplary embodiment, the switchable diffractive element 26 is one combined with a reflector 28. Here, this can be a liquid crystal display in the case of which a reflector layer 28 is arranged downstream of the liquid crystal elements. Such a switchable diffractive element 26 combined with a reflector 28 is advantageously more easy to fabricate than a radiation transmitting switchable diffractive element, since electronic components, for example electronic components included for control, which need not be transparent can be arranged downstream of the reflector 28.

The optical element 1 advantageously includes a holographic element 4 that functions as a directionally selective mirror 29 for the radiation 7 emitted from the luminous means 5, for example an LED. A light beam emitted from the luminous means 5 is deflected from the directionally selective mirror 29 toward the switchable diffractive element 26 combined with the reflector, and from the reflector 28 to the radiation exit surface 3 of the optical element 1.

Furthermore, by way of example the optical element 1 respectively has further optical elements, for example further holographic elements 4, on the radiation entrance surface 2 and the radiation exit surface 3. Alternatively, the radiation entrance surface 2 and/or the radiation exit surface 3 can also be provided with an optical microstructure, for example microlenses or microprisms.

Figure 22A:
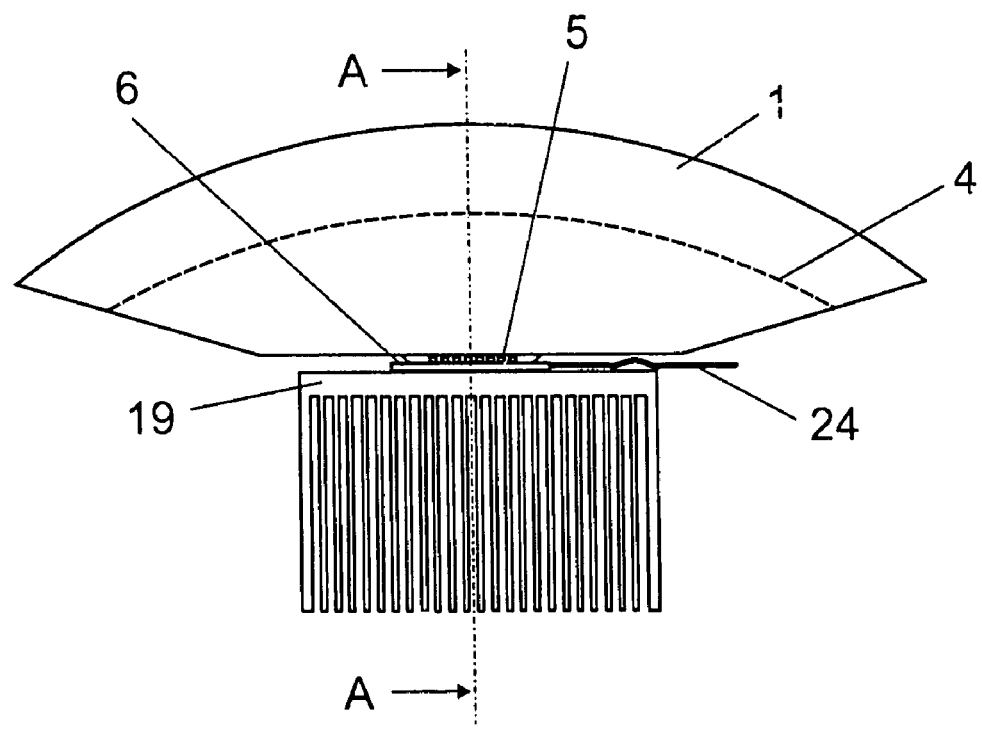
FIG. 22A shows a schematic graphic illustration of a cross section through an illuminating unit in accordance with a twenty second exemplary embodiment of the invention.
Figure 22B:
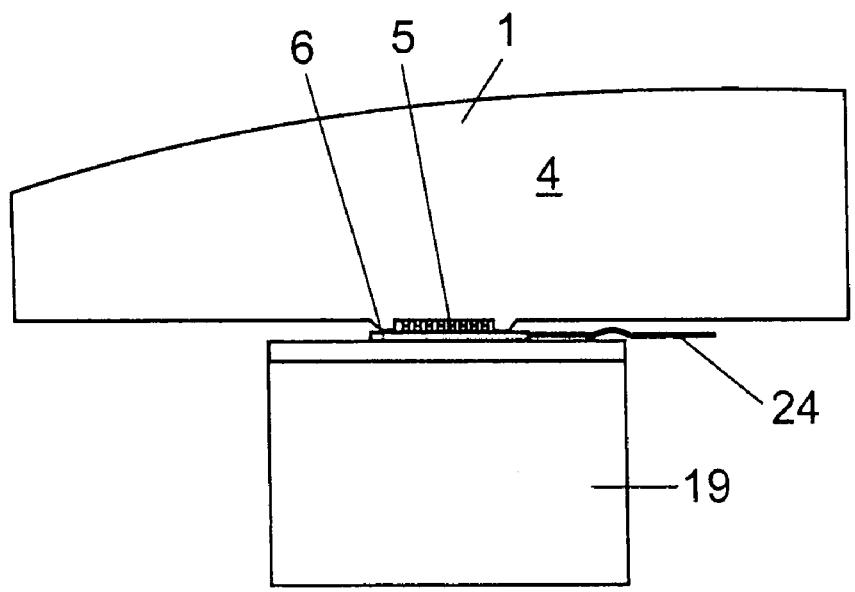
FIG. 22B shows a schematic graphic illustration of a cross section along the line A-A through an illuminating unit in accordance with the twenty second exemplary embodiment of the invention.
Figure 22C:
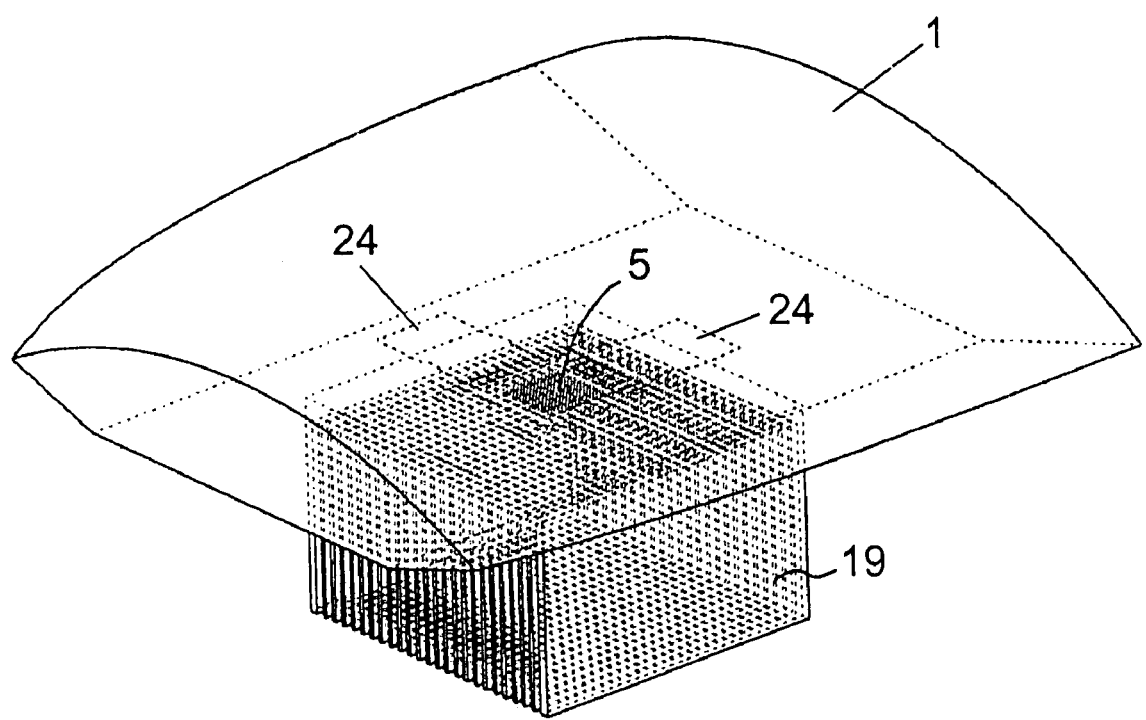
FIG. 22C shows a schematic perspective illustration of an illuminating unit in accordance with the twenty second exemplary embodiment of the invention.

Illustrated in FIGS. 22A, 22B and 22C is a further exemplary embodiment of the invention in the case of which the luminous means 5 is an LED matrix, for example composed of 8×8 LEDs. The illuminating unit is a motor vehicle headlight, the outer shape of the optical element 1 corresponding to the shape of a typical headlight cover. In order to protect against environmental influences such as, in particular, moisture, dirt or mechanical damage, the holographic element 4 included in the optical element 1 is in this case a volume hologram. The volume hologram can be generated in the entire volume of optical element 1, as indicated in FIG. 22B. The dashed line in FIG. 22A is to be understood as an indication that there is a volume hologram in the optical element, but it does not necessarily indicate a position. FIG. 22C is intended to show the three-dimensional shape of the optical element. With regard to the mode of operation and the further advantageous refinements, this exemplary embodiment corresponds otherwise to the exemplary embodiment described in FIGS. 17A and 17B.

The invention is not restricted to the description with the aid of the exemplary embodiments. Rather, the invention comprises each new feature and each combination of features, which includes, in particular, each combination of features in the patent claims, even when this feature or this combination is not itself explicitly specified in the patent claims or exemplary embodiments.

I claim:

1. An illuminating unit comprising:
   a luminous means;
   a first optical element comprising a radiation entrance surface facing toward the luminous means, and a radiation exit surface facing away from the luminous means;
   at least one first holographic element disposed in or on the first optical element and configured as a beam shaping element for shaping radiation emitted from the luminous means; and
   one of a second holographic element, a microlens array, and a microprism array arranged in or on the first optical element or another optical element of said illuminating unit, said first holographic element and said one of a second holographic element, a microlens array, and a microprism array being configured to reduce chromatic aberrations;
   wherein a second optical element is included as primary optics for the luminous means between the luminous means and the radiation entrance surface of the first optical element; and
   wherein the second optical element is a light guide.

2. The illuminating unit as claimed in claim 1, wherein the first optical element functions as a lens for the radiation emitted from the luminous means.

3. The illuminating unit as claimed in claim 1, wherein the first optical element has a height h of 8 mm or less.

4. The illuminating unit as claimed in claim 1, wherein the radiation exit surface of the first optical element is a substantially flat surface.

5. The illuminating unit as claimed in claim 1, wherein the first holographic element is a volume hologram formed in the first optical element.

6. The illuminating unit as claimed in claim 1, wherein the first holographic element is a surface hologram formed on a surface of the first optical element.

7. The illuminating unit as claimed in claim 1, wherein the luminous means comprises at least one LED chip.

8. The illuminating unit as claimed in claim 1, wherein the luminous means comprises a plurality of LED chips.

9. The illuminating unit as claimed in claim 8, wherein the plurality of LED chips are configured to be driven individually.

10. The illuminating unit as claimed in claim 1, wherein the one of a second holographic element, a microlens array, and a microprism array is disposed on at least one of the radiation entrance surface and the radiation exit surface of said first optical element.

11. The illuminating unit as claimed in claim 1, wherein at least one of the radiation entrance surface and the radiation exit surface has a reflection reducing coating.

12. The illuminating unit as claimed in claim 1, wherein the radiation entrance surface of the first optical element is a substantially flat surface.

13. The illuminating unit as claimed in claim 1, wherein the first optical element has at least one cutout at the radiation entrance surface.

14. The illuminating unit as claimed in claim 13, wherein the cutout is concavely curved.

15. The illuminating unit as claimed in claim 13, wherein the cutout has the shape of a conical frustum.

16. The illuminating unit as claimed in claim 1, wherein the radiation entrance surface has a Fresnel lens structure.

17. The illuminating unit as claimed in claim 1, wherein an immersion liquid is contained between the luminous means and the first optical element.

18. The illuminating unit as claimed in claim 1, wherein a distance d between the luminous means and the radiation entrance surface is 1 mm or less.

19. The illuminating unit as claimed in claim 1, wherein the first optical element is produced by injection molding.

20. The illuminating unit as claimed in claim 1, wherein the first holographic element includes a recording of a three dimensional graphic object that is reproduced during operation of the illuminating unit.

21. The illuminating unit as claimed in claim 20, wherein the three dimensional graphic object is a security feature.

22. The illuminating unit as claimed in claim 1, wherein the illuminating unit is a motor vehicle headlight.

23. The illuminating unit as claimed in claim 1, wherein the first optical element includes a switchable diffractive element.

24. An illuminating unit comprising:
   a luminous means;
   a first optical element comprising a radiation entrance surface facing toward the luminous means, a radiation exit surface facing away from the luminous means;
   at least one first holographic element disposed in or on the first optical element and configured as a beam shaping element for shaping radiation emitted from the luminous means; and
   one of a second holographic element, a microlens array, and a microprism array arranged in or on the first optical element or another optical element of said illuminating unit, said first holographic element and said one of a second holographic element, a microlens array, and a microprism array being configured to reduce chromatic aberrations;
   wherein the first optical element includes a switchable diffractive element.

* * * * *